(12) United States Patent
Song et al.

(10) Patent No.: US 11,837,977 B2
(45) Date of Patent: *Dec. 5, 2023

(54) SELF-RESONANCE TUNING PIEZOELECTRIC ENERGY WITH BROADBAND FREQUENCY

(71) Applicant: KOREA INSTITUTE OF SCIENCE AND TECHNOLOGY, Seoul (KR)

(72) Inventors: Hyun-Cheol Song, Seoul (KR); Chong Yun Kang, Seoul (KR); Jin Sang Kim, Seoul (KR); Ji-Won Choi, Seoul (KR); Seung Hyub Baek, Seoul (KR); Seong Keun Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 441 days.

This patent is subject to a terminal disclaimer.

(21) Appl. No.: 16/953,859

(22) Filed: Nov. 20, 2020

(65) Prior Publication Data
US 2021/0336561 A1 Oct. 28, 2021

(30) Foreign Application Priority Data
Apr. 27, 2020 (KR) .................. 10-2020-0050765

(51) Int. Cl.
*H02N 2/18* (2006.01)
*H10N 30/30* (2023.01)
*H10N 30/857* (2023.01)

(52) U.S. Cl.
CPC .......... *H02N 2/188* (2013.01); *H10N 30/304* (2023.02); *H10N 30/857* (2023.02)

(58) Field of Classification Search
CPC ..... H10N 30/857; H10N 30/304; H02N 2/188
See application file for complete search history.

(56) References Cited

U.S. PATENT DOCUMENTS 9,787,220 B2 10/2017 Herder et al.
11,245,345 B2 * 2/2022 Song .................. H10N 30/80

FOREIGN PATENT DOCUMENTS

KR 10-1190451 B1 10/2012
KR 10-1709396 B1 2/2017

* cited by examiner

*Primary Examiner* — J. San Martin
(74) *Attorney, Agent, or Firm* — NKL Law; Jae Youn Kim

(57) ABSTRACT

Proposed is a self-resonance tuning piezoelectric energy harvester with broadband frequency, including: a piezoelectric beam which is extended along a horizontal direction; a fixing member which fixes opposite ends of the piezoelectric beam; and a mobile mass which the piezoelectric beam passes through, and which is capable of self-movement along the piezoelectric beam through a through-hole which has a free space in addition to a space which the piezoelectric beam passes through, wherein as the mobile mass moves to a position of the piezoelectric beam, generated displacement of a piezoelectric beam is increased, and as the generated displacement becomes greater than the free space, the mobile mass is fixed to a position of a piezoelectric beam at which resonance will occur.

9 Claims, 11 Drawing Sheets

SELF-RESONANCE TUNING PIEZOELECTRIC ENERGY WITH BROADBAND FREQUENCY

CROSS-REFERENCE TO RELATED APPLICATIONS

This application claims priority to and the benefit of Korean Patent Application No. 10-2020-0050765 filed in the Korean Intellectual Property Office on Apr. 27, 2020, the contents of which are incorporated herein by reference in their entirety.

BACKGROUND

Technical Field

The present disclosure is related to a self-resonance tuning piezoelectric energy harvester with broadband frequency. More particularly, the present disclosure is related to a piezoelectric energy harvester in which a mobile mass having a clearance moves by itself to find a resonant position so that the frequency of external vibration and the natural frequency of the device match each other without additional energy supply to the device or modification in a piezoelectric structure, to maintain resonance phenomenon continuously even in environments in which the vibration frequency is variable.

Related Art

The domestic electric power demand has been increased every year, resulting in threatens of blackout in summer and winter when the electric power consumption is sharply increased. Efforts for stable acquisition of potential future energy resources, and for responding to increases in the electric power demand have been made all over the world. Further, new & renewable energy has been attracting great attention and in particular, it has been accelerated to develop the energy harvesting technology that converts solar power, wind power, wave power, heat, kinetic energy, etc., into electric energy.

A piezoelectric energy harvester in various energy harvesting technologies is a device that induces physical modification of a piezoelectric material from the external environment, thus converting mechanical energy into electric energy, and that is also in some kind of energy generation device capable of utilizing impact pressure, vibration, etc., wasted in surroundings, as energy.

In the case of a piezoelectric energy harvester using vibration, it is required to design a structure thereof so that the natural frequency of the device matches the resonance frequency at which generated displacement becomes a maximum. However, in this case, when the resonance frequency gets out of the fixed natural frequency of the device, the generated displacement is significantly decreased, thus decreasing a piezoelectric output significantly. Accordingly, a method for changing the natural frequency by using either nonlinear resonance features of a structure, or adjusting the size of an actuator or the structure has been conventionally used. However, this results in a significant decrease in the generated displacement in frequency bands other than the resonance frequency, and requires for additional energy supply from the outside. Thus, this is not efficient in terms of energy.

PRIOR ART DOCUMENT

Patent Document

Patent Document 1: KR Patent No. 1190451
Patent Document 2: KR Patent No. 1301695
Patent Document 3: U.S. patent application Ser. No. 14/256,286

SUMMARY

Technical Problem

Therefore, the present disclosure is provided to solve conventional problems as described above. In an embodiment in accordance with the present disclosure, a self-resonance tuning piezoelectric energy harvester is provided which has a wide operation frequency bandwidth because a mobile mass moves by itself to a position where the resonance of a piezoelectric beam occurs when an external variable vibration is applied, and which also maintains the resonance continuously, thus maximizing a piezoelectric out efficiency without additional supply.

Further, in another embodiment in accordance with the present disclosure, a self-resonance tuning piezoelectric energy harvester with broadband frequency has a simple structure composed of a piezoelectric beam and a mobile mass, and the mobile mass may be fixed by moving to a position on the piezoelectric beam where resonance occurs in response to external vibration. Therefore, the piezoelectric beam of the present disclosure is capable of efficiently generating electric energy in a wide frequency band while minimizing user intervention. The piezoelectric energy harvester according to an embodiment of the present disclosure can be applied to any environment in which a variable vibration is applied, and may be used as a power source of a low power sensor for implementing a smart factory in the future.

Further, in yet another embodiment in accordance with the present disclosure, a self-resonance tuning piezoelectric energy harvester with broadband frequency is provided which is capable of moving a mobile mass to a position of a piezoelectric beam at which resonance will occur as fast as possible through implementation of a maximum swing angle and a swing torque by analyzing a swing motion mechanism and a stop motion of the mobile mass.

Meanwhile, technical objects to be achieved in the present disclosure are not limited to the aforementioned technical objects, and other technical objects, which are not mentioned above, will be apparently understood to a person having ordinary skill in the art from the following description.

Technical Solution

According to a first aspect of the present disclosure, a self-resonance tuning piezoelectric energy harvester with broadband frequency, may include: a piezoelectric beam which is extended along a horizontal direction; a fixing member which fixes opposite ends of the piezoelectric beam; and a mobile mass which the piezoelectric beam passes through, and which is capable of self-movement along the piezoelectric beam through a through-hole which has a free space in addition to a space which the piezoelectric beam passes through, wherein as the mobile mass moves to a position of the piezoelectric beam, generated displacement of the piezoelectric beam is increased, and as the generated displacement becomes greater than the free space, the mobile mass is fixed to the position of the piezoelectric beam at which resonance will occur.

According to another aspect of the present disclosure, the self-resonance tuning piezoelectric energy harvester with broadband frequency may be characterized in that as the mobile mass moves to the position of the piezoelectric beam at which resonance will occur, a swing angle and a swing torque are increased, the swing angle is increased more than a designed swing angle of the mobile mass by the generated displacement at the position of the piezoelectric beam, and the mobile mass is fixed at the position of the piezoelectric at which resonance will occur by a frictional force with a surface of the piezoelectric beam.

According to another aspect of the present disclosure, a self-resonance tuning piezoelectric energy harvester with broadband frequency may be characterized in that the designed swing angle of the mobile mass is represented by following Equation 1, wherein a height of the free space is designed to have a maximum value within a range in which the mobile mass is fixed by the displacement generated when resonating the piezoelectric beam.

$$\theta = \tan^{-1} \text{ height of free space } (h)/\text{thickness of mobile mass } (t). \quad \text{[Equation 1]}$$

According to another aspect of the present disclosure, a self-resonance tuning piezoelectric energy harvester with broadband frequency may be characterized in that the swing torque of the mobile mass ($\tau$) is represented by following Equation 2, and is designed to be more than a specific value.

$$\tau = I\alpha$$

$$I = \int r^2 dm \quad \text{[Equation 2]}$$

wherein, I is a moment of inertia, $\alpha$ is an angular acceleration of the mobile mass, m is a mass of the mobile mass, and r is a distance from a center of gravity of the mobile mass to an outermost-shell thereof.

According to another aspect of the present disclosure, a self-resonance tuning piezoelectric energy harvester with broadband frequency may be characterized in that the mobile mass is configured so that a weight ratio of an outermost shell part of the mobile mass is over a specific ratio.

According to another aspect of the present disclosure, a self-resonance tuning piezoelectric energy harvester with broadband frequency may be characterized in that the mobile mass has an upper flange, a lower flange and a web unit which connects the upper flange and the lower flange, and the through-hole having the free space is formed on the web unit.

According to another aspect of the present disclosure, a self-resonance tuning piezoelectric energy harvester with broadband frequency may be characterized in that an output characteristic measured in the piezoelectric beam over time appears in a form of a sine wave, and the sine wave includes an inflection point at a point where a positive output is maximum.

According to another aspect of the present disclosure, a self-resonance tuning piezoelectric energy harvester with broadband frequency may be characterized in that the piezoelectric beam includes a substrate, and a piezoelectric energy harvester unit element which receives a bending moment, and the piezoelectric energy harvester unit element includes a first electrode, a piezoelectric material disposed on the first electrode, and a second electrode disposed in the piezoelectric material.

According to another aspect of the present disclosure, a self-resonance tuning piezoelectric energy harvester with broadband frequency may be characterized in that the piezoelectric material includes one piezoelectric multi- or monocrystal selected from the group consisting of PZT, $Pb(Zn_{1/3}Nb_{2/3})O_3$—$PbTiO_3$ (PZN-PT), $[Pb(Mg_{1/3}Nb_{2/3})O_3]$—$[PbTiO_3]$ (PMN-PT), $(Na_xK_{1-x})NbO_3$(NKN), $BaTiO_3$, ZnO, CdS and AlN, a piezoelectric mixture of at least one material consisting of Macrofiber composite (MFC) and 2-2 composite, or a polymer piezoelectric material including PVDF and PVDF-TrFE.

Advantageous Effects

According to the present disclosure, a self-resonance tuning piezoelectric energy harvester is provided which has a wide operation frequency bandwidth because a mobile mass moves by itself to a position where the resonance of a piezoelectric beam occurs when an external variable vibration is applied, and which also maintains the resonance continuously, thereby maximizing a piezoelectric out efficiency without additional supply.

Further, according to the present disclosure, a self-resonance tuning piezoelectric energy harvester with broadband frequency has a simple structure composed of a piezoelectric beam and a mobile mass, and the mobile mass may be fixed by moving to a position on the piezoelectric beam where resonance occurs in response to external vibration. Therefore, the piezoelectric beam of the present disclosure is capable of efficiently generating electric energy in a wide frequency band while minimizing user intervention. The piezoelectric energy harvester according to an embodiment of the present disclosure is applicable to any environment in which a variable vibration is applied, and may be used as a power source of a low power sensor for implementing a smart factory in the future.

Further, according to the present disclosure, a self-resonance tuning piezoelectric energy harvester with broadband frequency is provided which is capable of moving a mobile mass to a position of a piezoelectric beam at which resonance will occur as fast as possible through implementation of a maximum swing angle and a swing torque by analyzing a swing motion mechanism and a stop motion of the mobile mass.

Meanwhile, advantageous effects to be obtained in the present disclosure are not limited to the aforementioned effects, and other effects, which are not mentioned above, will be apparently understood to a person having ordinary skill in the art from the following description.

BRIEF DESCRIPTION OF THE DRAWINGS

The accompanying drawings of this specification exemplify a preferred embodiment of the present disclosure, the scope of the present disclosure will be more clearly understood from the following detailed description taken in conjunction with the accompanying drawings, and thus it will be understood that the present disclosure is not limited to only contents illustrated in the accompanying drawings.

DETAILED DESCRIPTION

Best Mode

Figure 1A:
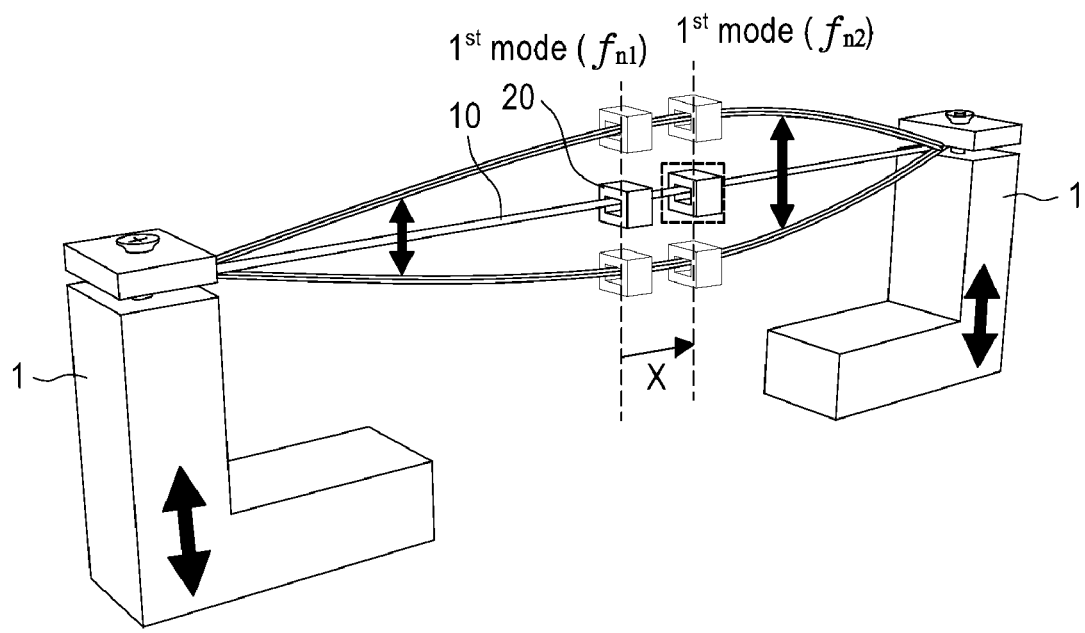
FIG. 1A is a perspective view of a self-resonance tuning piezoelectric energy harvester with broadband frequency according to an embodiment of the present disclosure.

The aforementioned objects of the present disclosure, other objects, characteristics and advantageous effects will be understood easily through the following preferable embodiments related to accompanying drawings. The present disclosure is not limited to embodiments to be herein described in detail but may be embodied into other forms. The embodiments are herein provided so as to make the present disclosure thorough and complete, and to make those skilled in the art fully understand the spirit of the present disclosure.

In the of the present disclosure, mentioning that a configuration element is on other configuration element, means that it may be formed directly on the other configuration element, or that there may be the third configuration element provided between them. Further, in the drawings, thicknesses of configuration elements are overstated to explain the technical content effectively.

The embodiments described in the present disclosure will be explained referring to cross-sectional views and plain views which are ideal exemplary drawings of the present disclosure. In the drawings, thicknesses of barriers and areas are overstated to explain the technical content effectively. Accordingly, forms of the exemplary drawings may be modified by fabrication technologies and/or allowable errors. Therefore, the embodiments of the present disclosure include changes in forms caused by fabrication processes rather than being limited to depicted specific forms. For example, an area shown as a right angle may be a form that is rounded or has a predefined curvature. Accordingly, the areas exemplified in the drawings have attributes, and shapes of the exemplified areas are to exemplify specific forms of the areas rather than limiting the scope of the present disclosure. In diverse embodiments of the present disclosure, terms of a first, a second and the like are used to describe different configuration elements, but these configuration elements should be not limited to these terms. These terms are merely used to distinguish one configuration element from others. The embodiments to be explained and exemplified herein include complementary embodiments thereof.

The terms used herein is to explain the embodiments but not intending to limit the present disclosure. In the present disclosure, the singular form includes the plural form unless otherwise mentioning in words. The terms 'comprise' and/or 'comprising' do not exclude the presence or addition of at least one different configuration elements.

In description of the following specific embodiments, various characteristic contents are prepared to explain the present disclosure in detail, and to help understanding thereof. However, those having a knowledge sufficient to understand the present invention in the art will aware that this disclosure may be used without such various characteristic contents. In a certain case, it is mentioned in advance that those well known in describing the disclosure but not really related thereto are not described in order to avoid any confusion caused.

Hereinafter, a self-resonance tuning piezoelectric energy harvester with broadband frequency will be described in terms of configuration, functions and operation mechanism thereof.

Figure 1B:
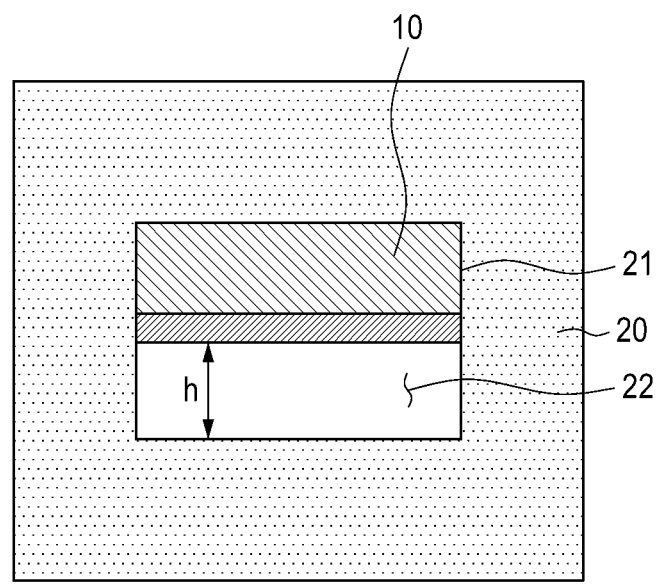
FIG. 1B is a cross-sectional view of a mobile mass according to an embodiment of the present disclosure.
Figure 1C:
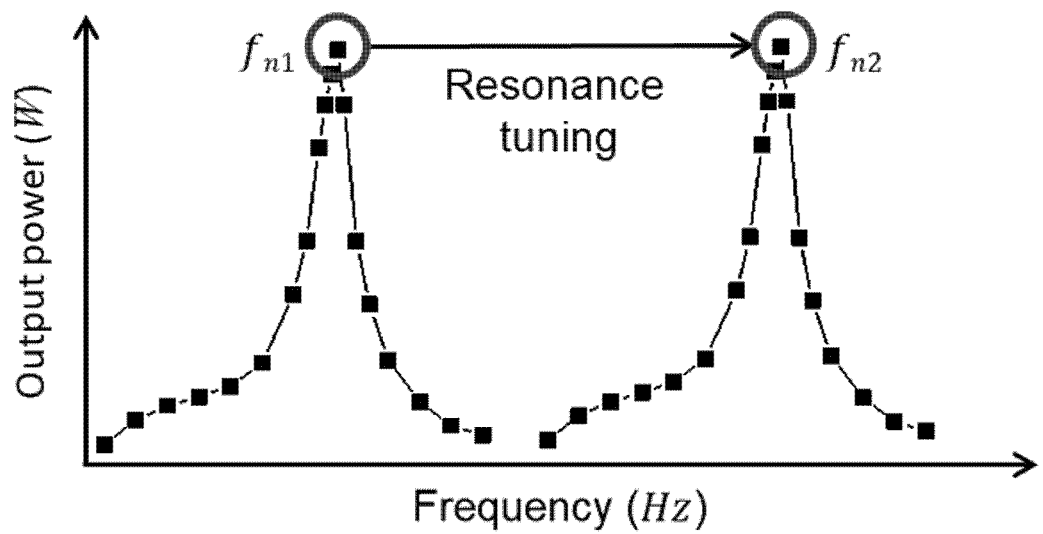
FIG. 1C is an output graph during resonance over $f_{n1}$, $f_{n2}$ input frequency according to an embodiment of the present disclosure.
Figure 1D:
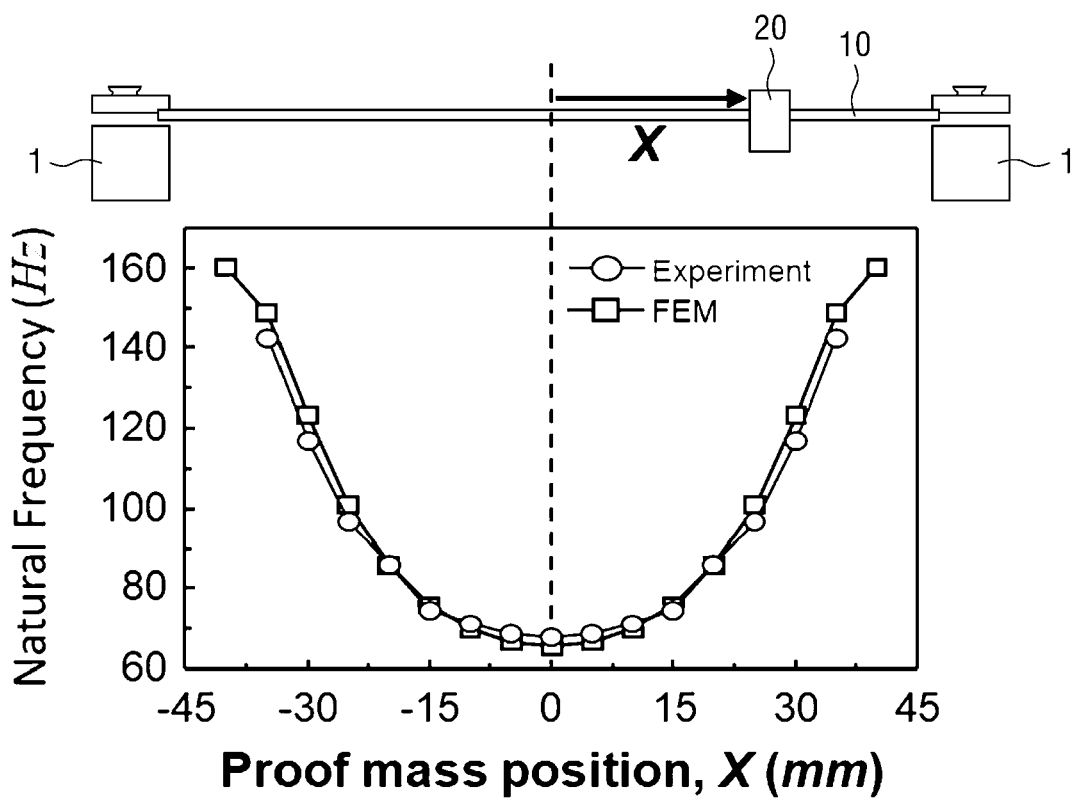
FIG. 1D is a graph illustrating characteristic of a resonance frequency over a change in a mobile mass position in a piezoelectric beam of FIG. 1A.

FIG. 1A is a perspective view of a self-resonance tuning piezoelectric energy harvester with broadband frequency according to an embodiment of the present disclosure. FIG. 1B is a cross-sectional view of a mobile mass according to an embodiment of the present disclosure. Further, FIG. 1C is an output graph during resonance over $f_{n1}$, $f_{n2}$ input frequency according to an embodiment of the present disclosure, and FIG. 1D is a graph illustrating characteristic of a resonance frequency over a change in a mobile mass position in a piezoelectric beam of FIG. 1A.

Figure 2A:
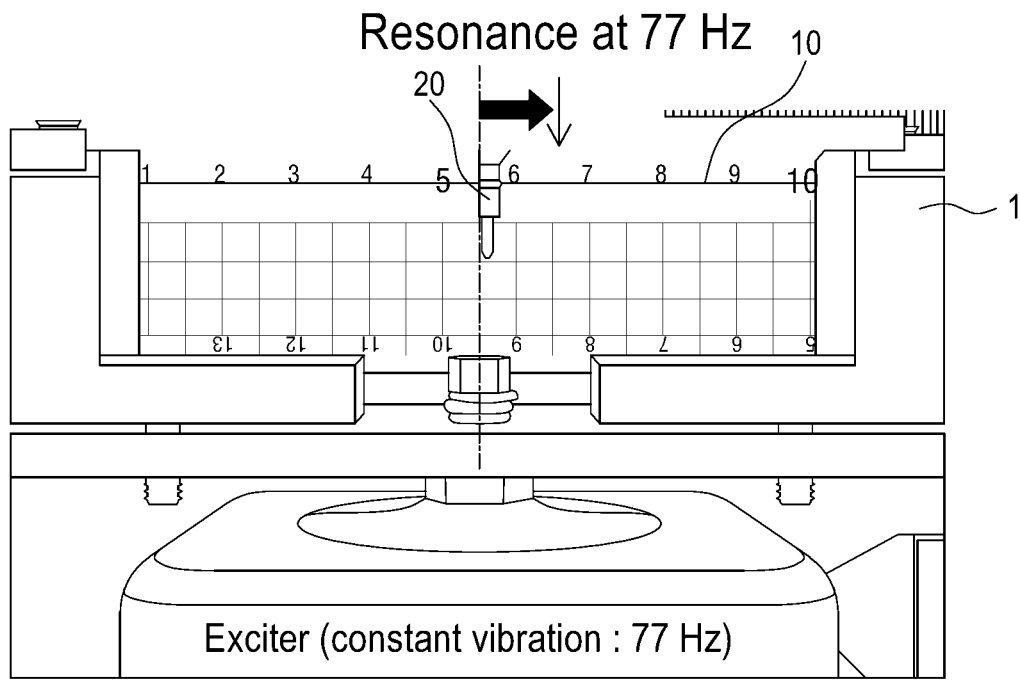
FIG. 2A is a self-resonance tuning piezoelectric energy harvester according to an embodiment of the present disclosure.
Figure 2B:
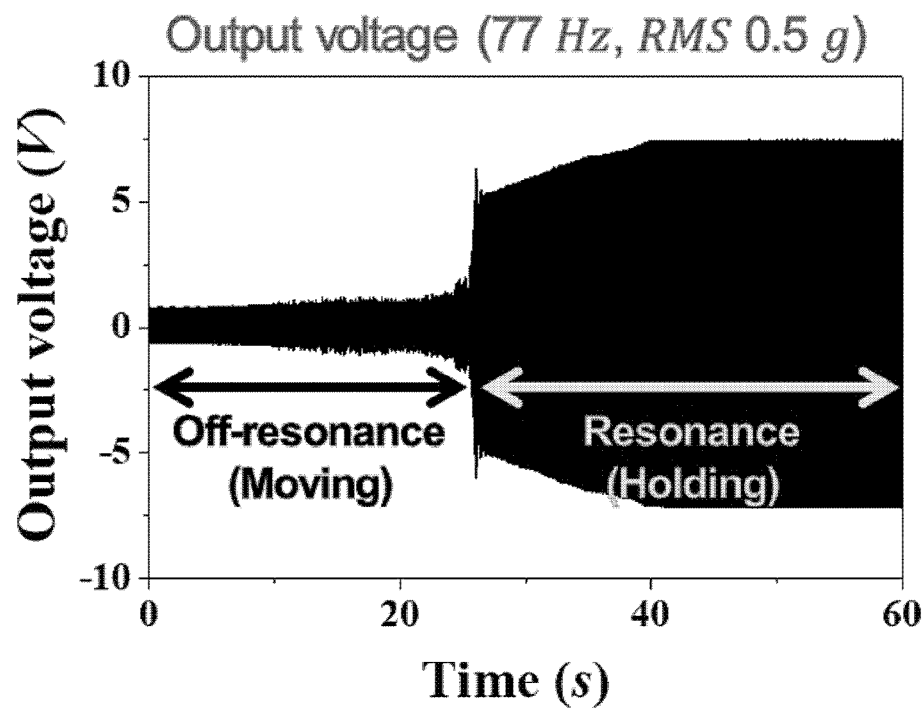
FIG. 2B is a graph illustrating output characteristics of the piezoelectric beam over time when applying an input frequency of 77 Hz in FIG. 2A.

FIG. 2A is a self-resonance tuning piezoelectric energy harvester according to an embodiment of the present disclosure. Further, FIG. 2B is a graph illustrating output characteristics of the piezoelectric beam over time when applying an input frequency of 77 Hz in FIG. 2A.

Figure 3:
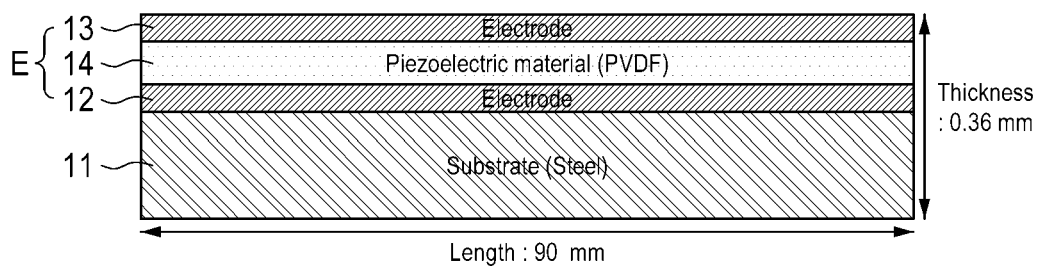
FIG. 3 is a cross-sectional view of the piezoelectric beam according to an embodiment of the present disclosure.

FIG. 3 is a cross-sectional view of the piezoelectric beam according to an embodiment of the present disclosure.

A shown in FIG. 1A, a piezoelectric beam 10 according to the present disclosure may be a form extending along a first direction D1. Herein, the first direction means a horizontal direction.

Opposite ends of the piezoelectric beam 10 may be fixed by a fixing member 1. The piezoelectric beam 10 may vibrate in the state that the opposite ends thereof are fixed.

A second direction may be a direction perpendicular to the extension direction of the piezoelectric beam 10. The piezoelectric beam 10 may vibrate up and down as shown in FIG. 1A. The piezoelectric beam 10 may generate voltage by the vibration.

The piezoelectric beam includes a substrate 11, and a piezoelectric energy harvester unit element E. The piezoelectric energy harvester unit element 10 may be disposed on the substrate 11. In some embodiments, a plurality of piezoelectric energy harvester unit elements may be provided.

At least one piezoelectric energy harvester unit element E may be configured with a first piezoelectric energy harvester unit element and a second piezoelectric energy harvester unit element symmetrically disposed with regard to the substrate 11. However, the present disclosure is not limited thereto, and the plurality of piezoelectric energy harvester unit elements E may be disposed on the substrate 11 in a sequential order, and may be implemented in various forms according to usage environments and design purposes.

The substrate 11 may be made of a metal, and may be connected to the fixing member 1. The substrate 11 may be a cantilever that has a high aspect ratio and is suitable for vibration environment. The substrate 11 may bend at a predefined curvature, and may distribute a physical force to the piezoelectric energy harvester unit element E and provide an ability to restore to its initial state. A voltage may be induced in the piezoelectric energy harvester unit element E with a change in position of the substrate 11.

The piezoelectric energy harvester unit element E may be disposed on the substrate 11 and receive a bending moment from the substrate 11. The harvester unit element E may include, a first electrode 12, a piezoelectric material 14 and a second electrode 13. The first electrode 12, the piezoelectric material 14, the second electrode 13 may have a sequential stack structure, and the first electrode 12 may be disposed on the substrate 11.

The first electrode 12 may be a piezoelectric electrode that transmits piezoelectric energy to the outside when the piezoelectric material 14 generates the piezoelectric energy, and may include a conductor having high electrical conductivity. The second electrode 13 may be disposed on the piezoelectric material 14, may be a piezoelectric electrode that transmits piezoelectric energy to the outside when the piezoelectric material 14 generates the piezoelectric energy, and may include a conductor having high electrical conductivity.

The piezoelectric material 14 may include a material that generates voltage from an external force based on the piezoelectric effect. The mechanical distortion by the stress transmitted to the piezoelectric material 14 causes dielectric polarization in the material, generating a potential difference across the piezoelectric material 14. The first electrode 12 and the second electrode 13 disposed on and under the piezoelectric material 14 may have a potential difference, and a corresponding magnitude of voltage may be generated.

The piezoelectric material 14 may include one piezoelectric multi or mono crystal selected from the group consisting of PZT, $Pb(Zn_{1/3}Nb_{2/3})O_3$—$PbTiO_3$ (PZN-PT), $[Pb(Mg_{1/3}Nb_{2/3})O_3]$—$[PbTiO_3]$ (PMN-PT), $(Na_xK_{1-x})NbO_3$ (NKN), $BaTiO_3$, ZnO, CdS and AlN. Alternatively, the piezoelectric material 14 may include a piezoelectric mixture of at least one material selected from the above-described group, such as Macrofiber composite (MFC) and 2-2 composite. In another embodiment, the piezoelectric material 14 may be a polymer piezoelectric material such as PVDF and PVDF-TrFE.

The piezoelectric material 14 may be formed of various types such as a thin-film type polymer based film structure and a mixture of a nano/micro structure material and a polymer, but is not limited thereto. In this embodiment, when considering that the piezoelectric beam 10 generates a large displacement by the resonance frequency, the piezoelectric material 14 may be formed with a PVDF polymer based film structure that has a good mechanical strength and is soft and flexible.

The piezoelectric energy harvester 100 may further include a vibration generation element (not illustrated) to provide vibration to the substrate 11 at a predefined input frequency, an energy storage circuit (not illustrated) to rectify and accumulate voltage generated by the piezoelectric energy harvester unit element E, and a housing (not illustrated) to receive each component of the piezoelectric energy harvester 10.

The mobile mass 20 according to the present disclosure, as shown in FIG. 1A, is connected to the piezoelectric beam 10 movably along the piezoelectric beam 10. The mobile mass 20 may be made of a metal having a higher density than the substrate 11, and may extend the maximum strain of the piezoelectric beam 10 to increase the amount of electricity generated from the piezoelectric energy harvester 100.

The piezoelectric energy harvester 100 may be provided with an input frequency from the outside, and the piezoelectric beam 10 may resonate by the input frequency. The mobile mass 20 may resonate with the input frequency provided from the outside in a state of being connected to the piezoelectric beam 10, and when the mobile mass 20 resonates with the external input frequency, displacement of the piezoelectric beam 10 may be extended more, thus generating a larger amount of voltage. However, the mobile may 20 may differ in frequency at which resonance will occur depending on a position at which the mobile mass 20 is connected to the piezoelectric beam 10.

FIG. 1D is a graph illustrating characteristic of a resonance frequency over a change in a mobile mass position in a piezoelectric beam of FIG. 1A. When defining that a virtual line that divides the piezoelectric beam 10 into two in the second direction, is a center of the piezoelectric beam, a resonance frequency of the mobile mass 20 may be increases as much as becoming far from the center of the piezoelectric beam toward the fixing member 1. According to the theory of mechanical vibrations, a resonance frequency relies on the mass and spring constant of a vibration system. The mass of the entire structure is constant, while the farther away from the center of the piezoelectric beam, the higher the spring constant, and the higher the resonance frequency at which the mobile mass 20 will resonate. This feature is equally found in data measured according to the experiment and data calculated by the finite element method as shown in FIG. 1D. It can be seen that as it is far away leftward and rightward from the center of the piezoelectric beam, the resonance frequency increases, and this is measured and calculated in a symmetrical shape.

Here, the mobile mass 20 according to this embodiment may move by itself to a position of the piezoelectric beam 10 at which resonance will occur with the input frequency provided from the outside, and may be fixed to the position at which resonance occurs, inducing vibration of the piezoelectric beam 10 to generate a large amount of voltage. The mobile mass 20 may move in the left or right direction relative to the center of the piezoelectric beam 10. The mobile mass 20 may include a through-hole 21 through which the piezoelectric beam 10 passes, and may move the position through the through-hole 21. The piezoelectric energy harvester 100 according to an embodiment of the present disclosure may be a self-resonance tuning piezoelectric energy harvester that enables self-resonance tuning by the position movement of the mobile mass 20.

Figure 4A:
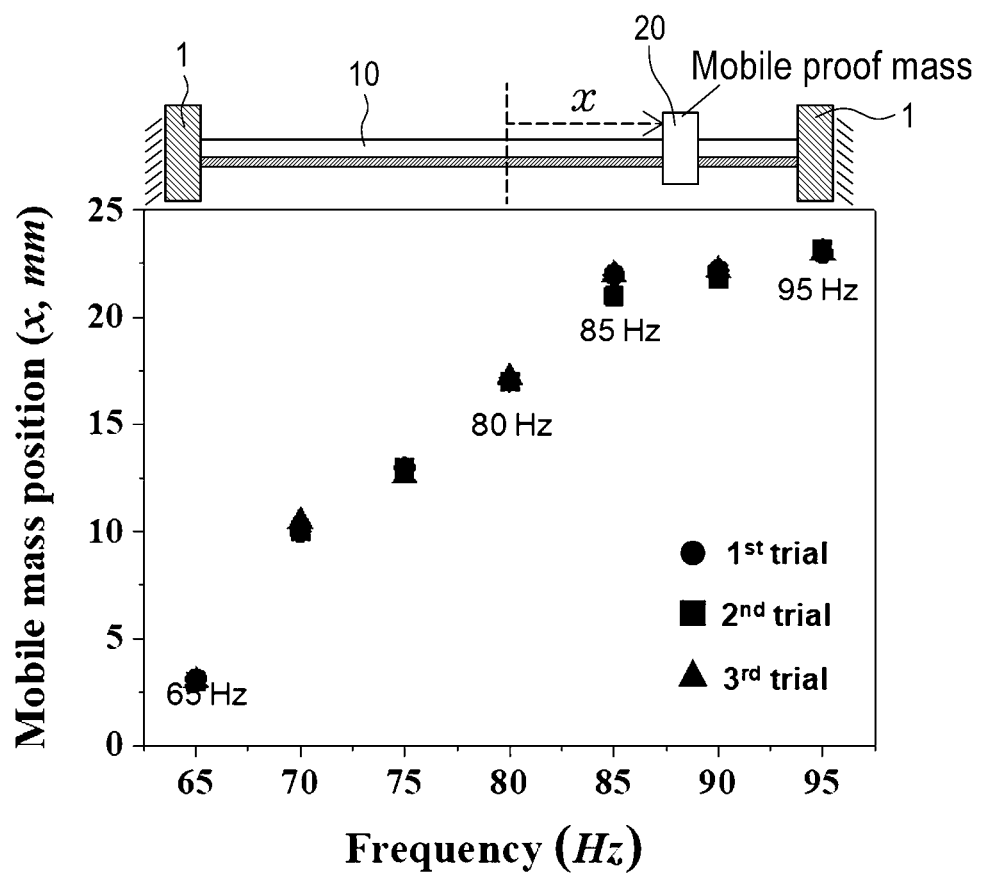
FIG. 4A is a graph showing an experiment result for frequencies over a mobile mass position.
Figure 4B:
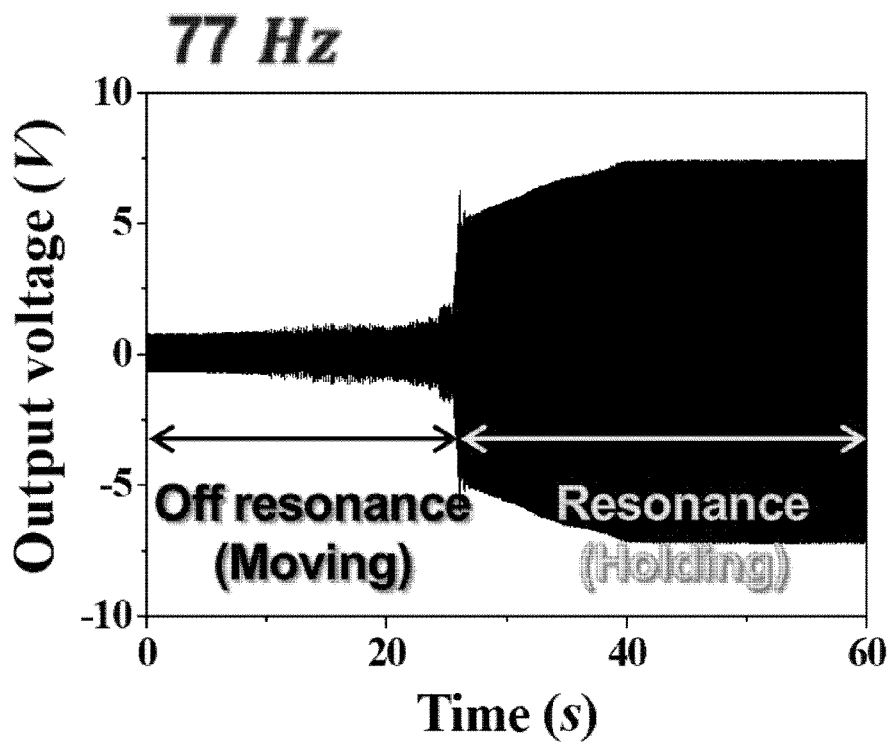
FIG. 4B to 4D are graphs illustrating output characteristics over time when applying input frequencies of 77 Hz, 80 Hz, 85 Hz, respectively.
Figure 4C:
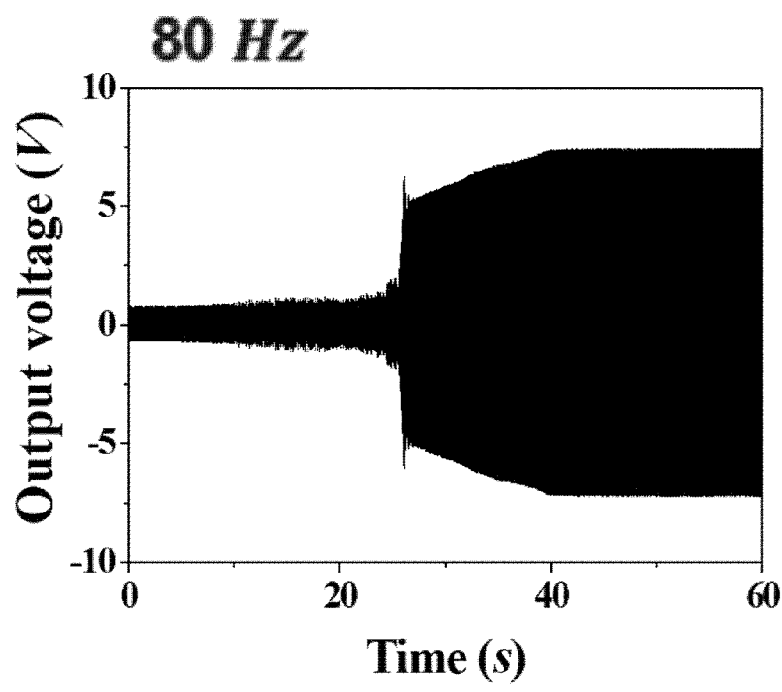
Figure 4D:
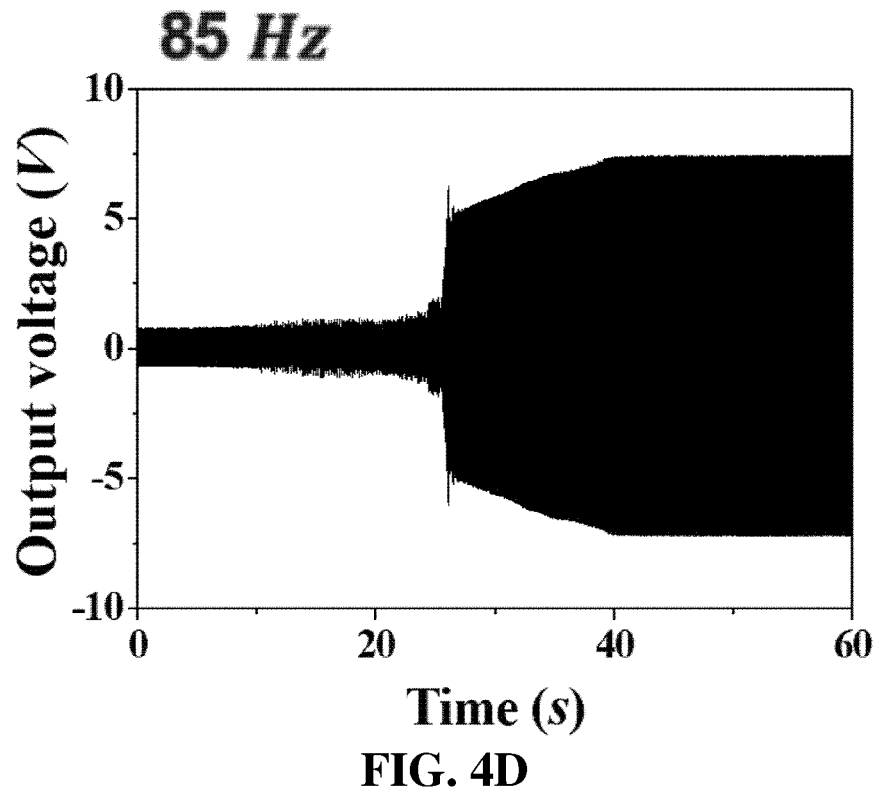

FIG. 4A is a graph showing an experiment result for frequencies over a mobile mass position. Further, FIG. 4B to 4D are graphs illustrating output characteristics over time when applying input frequencies of 77 Hz, 80 Hz, 85 Hz, respectively. As considering that there is a similar tendency to increase an output of piezoelectric beam significantly from at a specific time as time goes by even when a frequency is changed from at 77 Hz to 80 Hz and 85 Hz consecutively, it is understood that resonance may occur automatically by movement of the mobile mass even in a frequency variable environment.

Figure 5A:
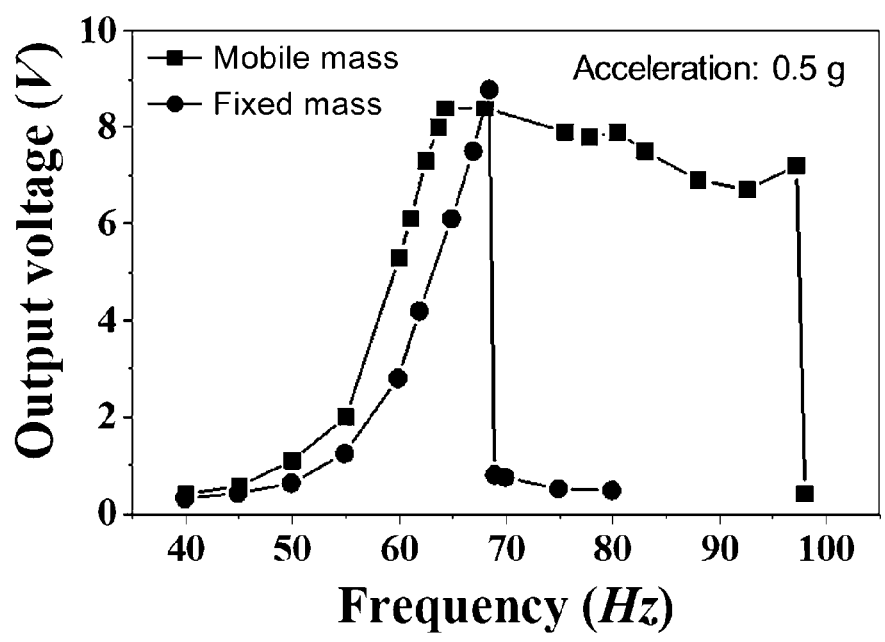
FIG. 5A is a graph showing comparison of maximum output characteristics over input frequency bandwidths between a fixed mass and a mobile mass.
Figure 5B:
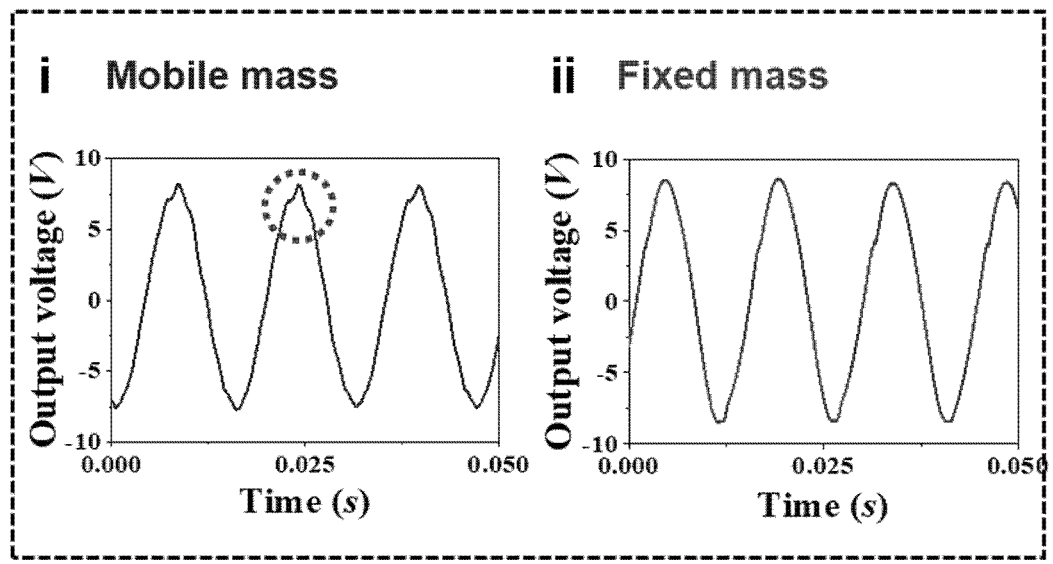
FIG. 5B is an enlarged graph of output characteristics of the piezoelectric energy harvester according to the present disclosure (left hand side) and an enlarged graphs of output characteristics of a piezoelectric energy harvester having a conventional structure (right hand side).
Figure 5C:
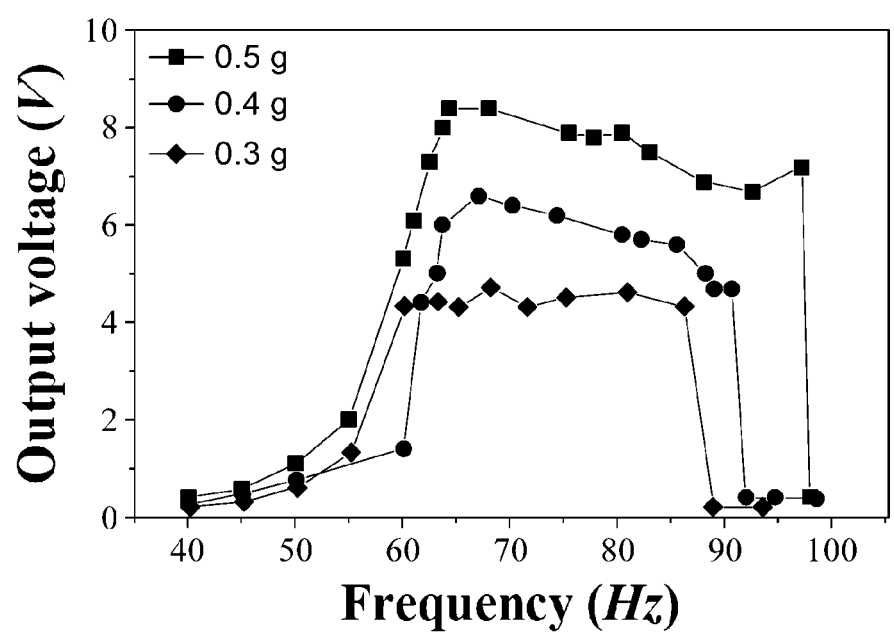
FIG. 5C is a graph showing output characteristics over mass of the mobile mass according to an embodiment of the present disclosure.
Figure 5D:
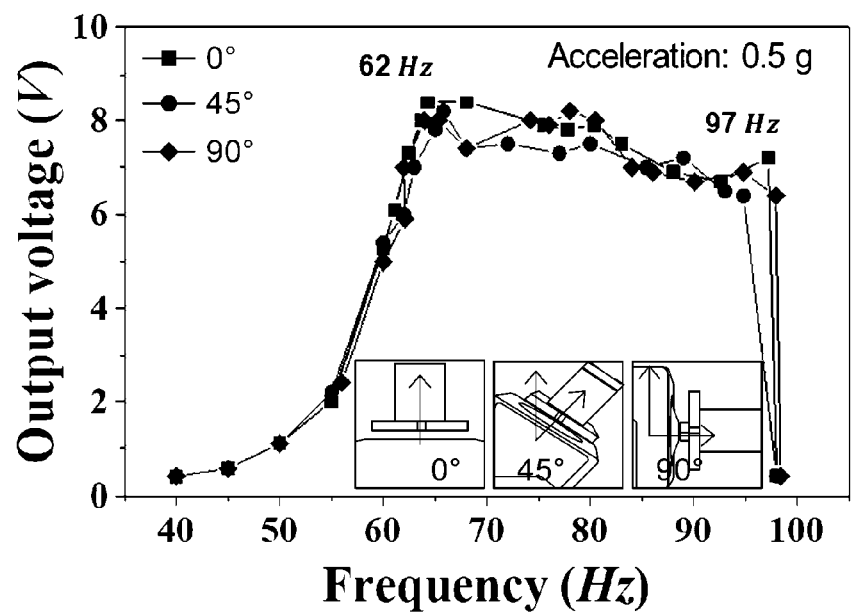
FIG. 5D is a graph showing output characteristics over vibration angle according to an embodiment of the present disclosure.

Further, FIG. 5A is a graph showing comparison of maximum output characteristics over input frequency bandwidths between a fixed mass and a mobile mass. FIG. 5B is an enlarged graph of output characteristics of the piezoelectric energy harvester according to the present disclosure (left hand side) and an enlarged graphs of output characteristics of a piezoelectric energy harvester having a conventional structure (right hand side). FIG. 5C is a graph showing output characteristics over mass of the mobile mass according to an embodiment of the present disclosure.

The mobile mass 20 is not fixed to the piezoelectric beam 10 in a situation that an input frequency is not provided from the outside of the piezoelectric beam 10. When a vibration is generated in the piezoelectric beam 10 as an input frequency is provided from the outside, a position where the mobile mass 20 is connected to the piezoelectric beam 10 may be moved, and the moving range of the mobile mass 20 may be limited to an extended length of the piezoelectric beam 10, a space defined by the fixing member 1.

The mobile mass 20 includes a through hole 21, and as shown in FIG. 1B, may be connected to the piezoelectric beam 10 through the through hole 21. The through hole 21 may include a free space 22 in addition to the space through which the piezoelectric beam 10 passes.

That is, the mobile mass 20 and the piezoelectric beam 10 may be connected including a clearance, and the mobile mass 20 may be move along the piezoelectric beam 10 through the clearance corresponding to the free space 22, while the mobile mass 20 is connected to the piezoelectric beam 10. The vertical height of the through hole 21 may be configured to be higher than the vertical thickness of the piezoelectric; beam 10 thus having the free space 22.

The mobile mass 10 is moved along the extending direction of the body piezoelectric beam 10 maintaining a connection with the piezoelectric beam 10 through the free space 22 of the through hole 21, so that the position contacted with the piezoelectric beam 10 is changed. Namely, as described later, as the mobile mass 20 undergoes a swing motion through this free space, the mobile mass 20 may be moved to a position of the piezoelectric beam 10 at which resonance will occur.

Hereinafter, the movement of the mobile mass 20 will be described in more detail together with the output characteristics of the piezoelectric energy harvester of the present invention. The mobile mass 20 may be located at the center of the piezoelectric beam 10 at an initial time when an input frequency is provided, and may be moved by itself to find a resonance region of the piezoelectric beam 10 that matches an external vibration source.

When an input frequency of a predetermined size is provided to the piezoelectric energy harvester 100, the piezoelectric beam 10 may be vibrated with a sine wave having a shape such as a primary resonance, and such displacement is smaller than the free space 22 of a through hole 21 of the mobile mass.

That is, the displacement generated before the mobile mass 20 moves to the position of the piezoelectric beam 10 where resonance occurs may be smaller than the free space 22 of the mobile mass 20, and the mobile mass 20 may be capable of moving along the piezoelectric beam 10 while being connected to the piezoelectric beam 10. In a situation that vibration is partially generated, the movement of the mobile mass 20 may be easier.

However, as the mobile mass 20 gradually moves to the position of the piezoelectric beam 10 capable of resonating, the generated displacement of the piezoelectric beam 10 increases, and this generated displacement is larger than the free space 22 of the through hole 21 of the mobile mass 20. In the graphs of FIG. 2B, 4B to 4D, it has been measured that resonance has occurred since about 28 seconds have passed, but it can be seen that the output voltage is significantly increased than the off-resonant state.

As the mobile mass 20 moves to the position of the piezoelectric beam 10 in which resonance occurs, the mobile mass 20 may be fixed to the position of the piezoelectric beam 10 in which resonance occurs according to the increased displacement of the piezoelectric beam 10.

As the mobile mass 20 moved to the position of the piezoelectric beam 10 capable of generating resonance is fixed at a position capable of resonating to enlarge the displacement of the piezoelectric beam 10, the piezoelectric energy harvester 100 may generate a high output voltage continuously. In the graphs of FIG. 2B, 4B to 4D, it can be seen that the voltage generated since about 41 seconds have passed is output to the maximum and the maximum output voltage is continuously maintained. In addition, it can be seen that the maximum output voltage in the off-resonance is 1.2V, but in resonance, the output voltage markedly increases to 8.1V due to the enlargement of the displacement.

As shown in FIG. 5B, the output of the piezoelectric energy harvester over time, the output characteristics with time measured in the piezoelectric beam appear in a sine wave form, and it can be seen that resonance of the piezoelectric beam 10 occurred in the primary mode. The through hole 21 of the mobile mass 20 of the piezoelectric energy harvester according to the embodiment of the present disclosure includes the free space 22, that is, a clearance, and thus an inflection point (the circled portion in the graph of FIG. 5B) appears at a position where the output of the positive sine wave is maximized. This is not seen in the output characteristics of a piezoelectric energy harvester having the conventional structure.

As described above, the resonant frequency at which the mobile mass 20 resonates may be different depending on the position of the connected piezoelectric beam 10, and the input frequency provided to the piezoelectric beam 10 may vary depending on space and environment for being located at the piezoelectric energy harvester 10.

However, in the piezoelectric energy harvester 10 according to the embodiment of the present disclosure, the mobile mass 20 may be moved by itself to a position of the piezoelectric beam 10 resonating with an input frequency provided from the outside, and the production of a high output voltage may be induced while continuously maintained at the corresponding position. That is, the piezoelectric energy harvester 100 according to the embodiment of the present disclosure may enlarge displacement as the mobile mass 20 is moved to a position capable of resonating with an input frequency provided from the outside, and thus providing high output in a wide range of input frequencies, compared to the conventional structure in which a mass is fixed.

That is, as shown in FIG. 5A, in the case of a fixed type mass, the maximum power may be appeared only at a specific frequency. That is, the fixed type mass may be fixed to a position that may resonate at a specific frequency, and when the frequency provided from the outside is changed, the position is fixed, and thus resonance is not allowable.

Alternatively, the mobile mass 20 of the present disclosure is capable of providing a high output in a wide frequency bandwidth rather than a fixed frequency. In other words, the mobile mass 20 of the present disclosure is capable of inducing the generated displacement of the piezoelectric beam 10 to the maximum and maximizing the electric production capacity of the piezoelectric energy harvester 100 on the basis of the principle of continuously moving to find the resonant position.

Figure 6:
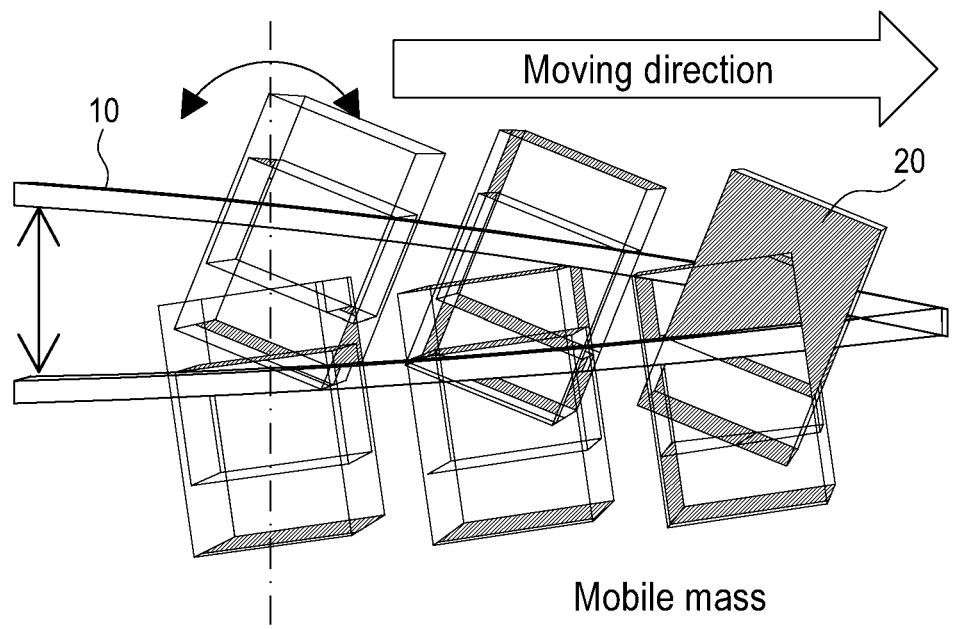
FIG. 6 is a schematic diagram showing a swing motion mechanism of the mobile mass according to an embodiment of the present disclosure.
Figure 7:
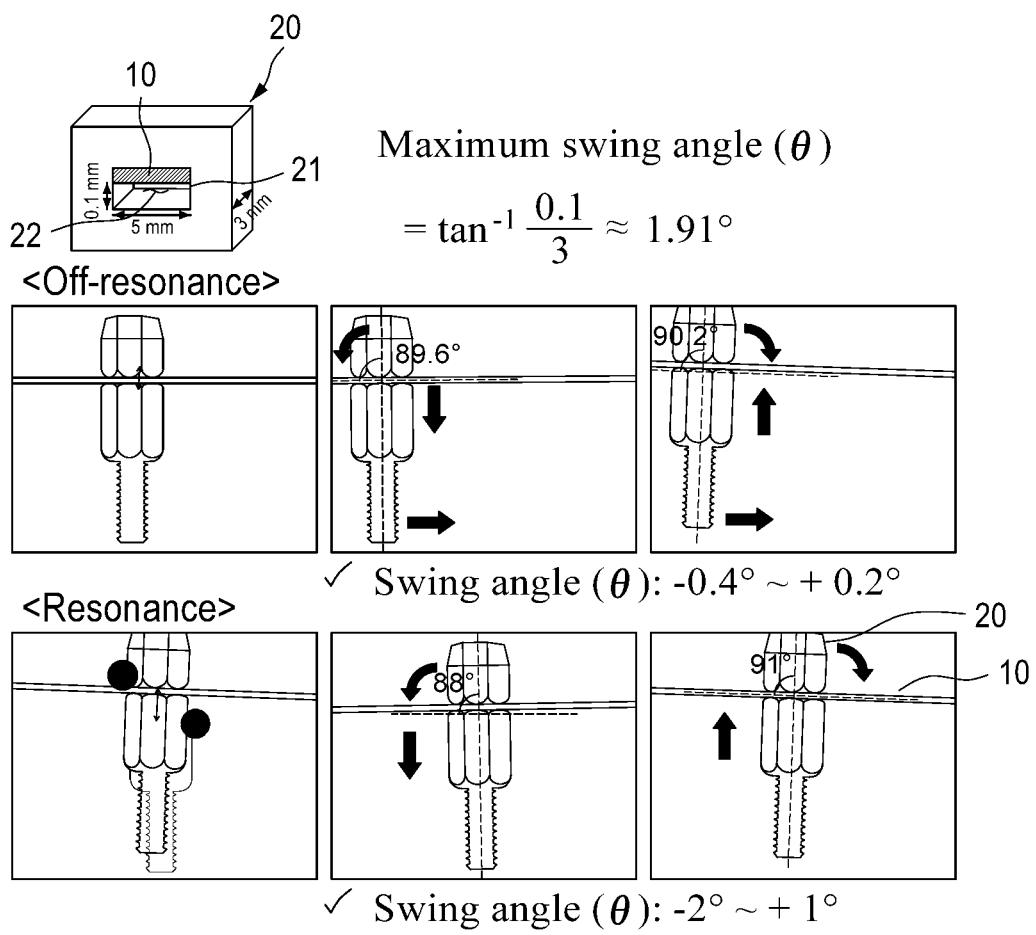
FIG. 7 shows a maximum swing angle of the mobile mass according to an embodiment of the present disclosure, and swing angles during off-resonance and resonance.
Figure 8:
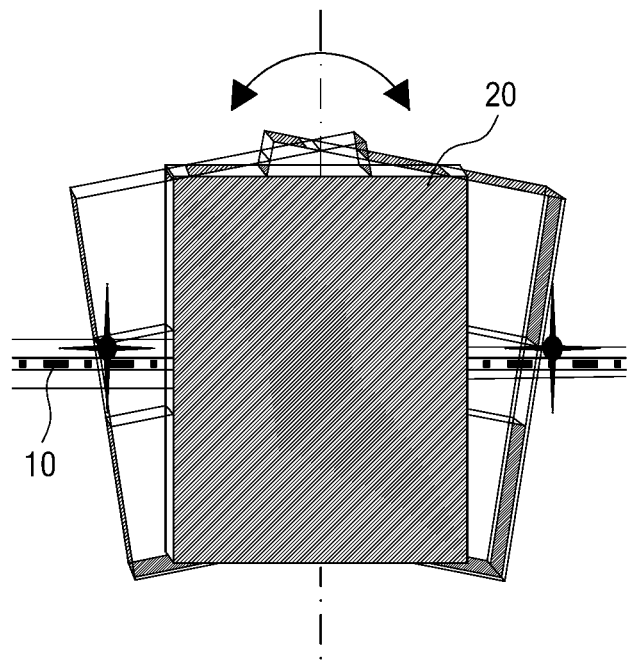
FIG. 8 is a schematic view showing a swing torque of the mobile mass according to an embodiment of the present disclosure.

FIG. 6 is a schematic diagram showing a swing motion mechanism of the mobile mass according to an embodiment of the present disclosure. FIG. 7 shows a maximum swing angle of the mobile mass according to an embodiment of the present disclosure, and swing angles during off-resonance and resonance. FIG. 8 is a schematic view showing a swing torque of the mobile mass according to an embodiment of the present disclosure.

As shown in FIG. 6, it can be seen that the movement of the mobile mas 20 is embodied with swing motion mechanism. That is, it can be seen that the swing motion mechanism of the mobile mass 20 may vary depending on the size of the free space 22 by the generated displacement of the piezoelectric beam 10.

In addition, as a swing angle becomes larger, the mobile mass 20 may be moved more rapidly to a position of the piezoelectric beam 10, at which resonance will occur.

As shown in FIG. 7, as the mobile mass 20 moves to the position of the piezoelectric beam 10, at which resonance will occur, a swing angle by the generated displacement of the mobile mass 20 is increase. In addition, the swing angle by the displacement generated at the position of the piezoelectric beam 10, at which resonance will occur is increased more than a designed swing angle, and thus the mobile mass 20 is fixed at the position of the piezoelectric beam 10, at which resonance will occur.

At this time, it is preferable that the designed swing angle of the mobile mass 20 is smaller than a swing angle by displacement generated at the position at which resonance will occur, but is the most approximate value therewith. That is, the designed swing angle θ of the mobile mass 20 is represented by following Equation 1, wherein a height of the free space h is designed to have a maximum value within a range in which the mobile mass 20 is fixed by the displacement generated when resonating the piezoelectric beam 10:

$$\theta = \tan^{-1} \text{height of free space } (h)/\text{thickness of mobile mass } (t).$$ [Equation 1]

Further, when the mobile mass 20 according to the embodiment of the present disclosure undergoes a swing motion by the motion mechanism, the more the mobile mass has a large swing torque, the faster the mobile mass may be moved to the position of the piezoelectric beam, at which resonance will occur. Namely, the larger the swing torque becomes, the more a moving velocity of the mobile mass 20 is increased.

Figure 9:
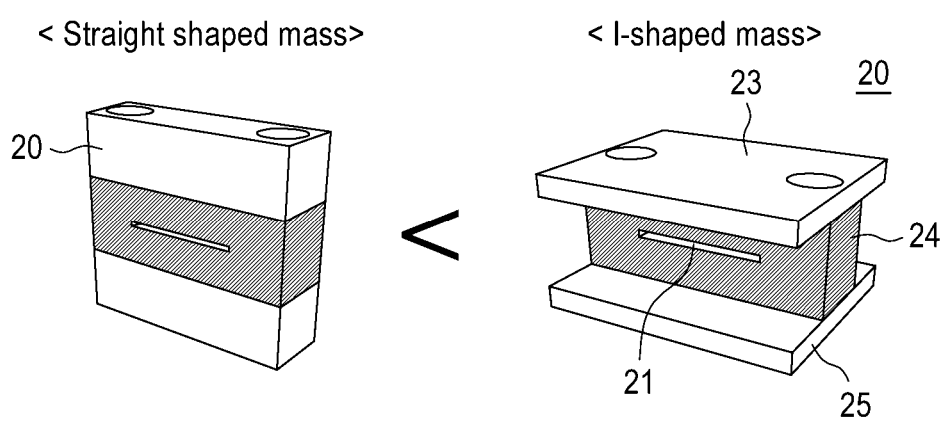
FIG. 9 is a view explaining a shape design of the mobile mass for improving a swing torque according to an embodiment of the present disclosure.
Figure 10:
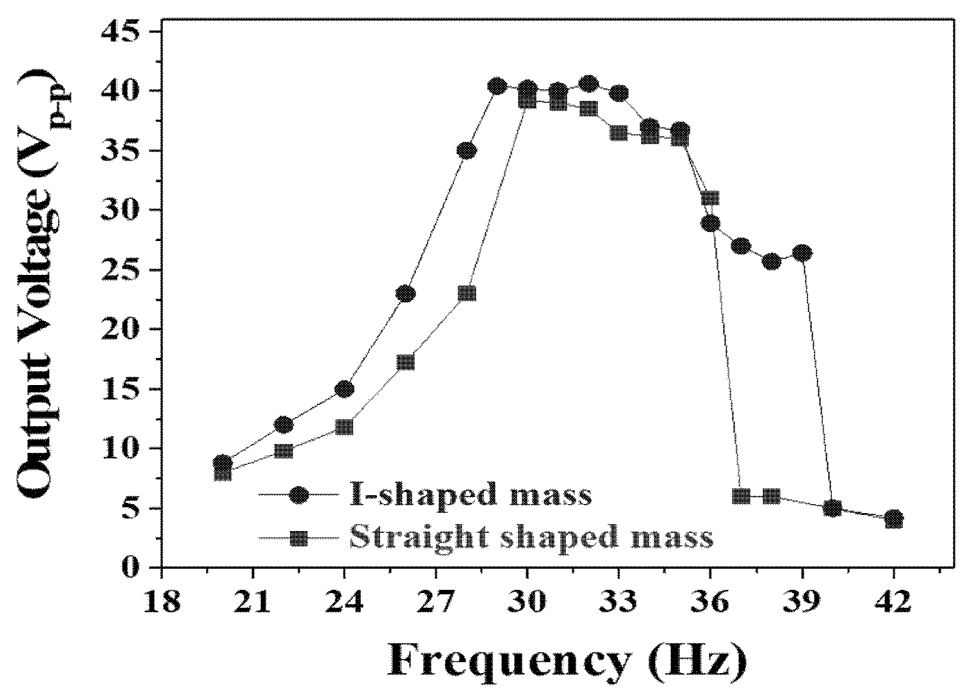
FIG. 10 is a graph illustrating comparison output characteristics between a rectangular shaped mobile mass and an I-shaped mobile mass.

FIG. 9 is a view explaining a shape design of the mobile mass for improving a swing torque according to an embodiment of the present disclosure. FIG. 10 is a graph illustrating comparison output characteristics between a rectangular shaped mobile mass and an I-shaped mobile mass.

the swing torque of the mobile mass (τ) is represented by following Equation 2, and is designed to be more than a specific value:

$$\tau = I\alpha$$

$$I = \int r^2 dm$$ [Equation 2]

wherein, I is a moment of inertia, α is an angular acceleration of the mobile mass, m is a mass of the mobile mass, and r is a distance from a center of gravity of the mobile mass to an outermost-shell thereof.

Thus, in order to increase the swing torque, the mobile mass 20 needs to have a shape capable of increasing the moment of inertia, and this shape may be achieved by increasing a mass ratio of an outermost-shell part.

The mobile mass 20 according to the embodiment of the present disclosure, as shown in FIG. 9, may have an I beam shape.

That is, the mobile mass 20 according to the embodiment of the present disclosure, may be configured to include an upper flange 23, a lower flange 25, and a web unit 24 which connects the upper flange and the lower flange. The through-hole having the free space is formed at a center portion of the web unit.

When applying this I-shaped mobile mass 20, as shown in FIG. 10, the mobile mass is moved fast to the position of the piezoelectric beam 10, at which resonance will occur, by increasing a moving velocity, and output characteristics may be also improved.

Therefore, the self-resonance tuning piezoelectric energy harvester with broadband frequency according to the embodiment of the present disclosure is efficient in terms of energy, is applicable to any environment where a variable vibration is applied, and may be used as a power source of a low power sensor for implementing a smart factory in the future.

In addition, the configuration and method of the aforementioned embodiments are not applied limitedly to the apparatus and method as described above, but the whole or parts of the respective embodiments may be optionally combined in order to achieve various modifications of the above embodiments.

REFERENCE NUMBERS

1: Fixing member
10: Piezoelectric beam
11: Substrate
12: First electrode
13: Piezoelectric material
14: Second electrode
20: Mobile mass
21: Through hole
22: Free space
23: Upper flange
24: Web unit
25: Lower flange
h: Height of free space
t: Thickness of mobile mass
100: Self-resonance tuning piezoelectric energy harvester with broadband frequency

The invention claimed is:

1. A self-resonance tuning piezoelectric energy harvester with broadband frequency, the harvester comprising:
    a piezoelectric beam which is extended along a horizontal direction;
    a fixing member which fixes opposite ends of the piezoelectric beam; and
    a mobile mass which the piezoelectric beam passes through, and which is capable of self-movement along the piezoelectric beam through a through-hole which has a free space in addition to a space which the piezoelectric beam passes through,
    wherein as the mobile mass moves to a position of the piezoelectric beam, generated displacement of the piezoelectric beam is increased, and as the generated displacement becomes greater than the free space, the mobile mass is fixed to the position of the piezoelectric beam at which resonance will occur.

2. The self-resonance tuning piezoelectric energy harvester with broadband frequency according to claim 1, wherein
    as the mobile mass moves to the position of the piezoelectric beam at which resonance will occur, a swing angle and a swing torque are increased, and the swing angle is increased more than a designed swing angle of the mobile mass by the generated displacement at the position of the piezoelectric beam, and the mobile mass is fixed at the position of the piezoelectric at which resonance will occur by a frictional force with a surface of the piezoelectric beam.

3. The self-resonance tuning piezoelectric energy harvester with broadband frequency according to claim 2, wherein
    the designed swing angle of the mobile mass is represented by following Equation 1, wherein a height of the free space is designed to have a maximum value within a range in which the mobile mass is fixed by the displacement generated when resonating the piezoelectric beam:

$$\theta = \tan^{-1} \text{ height of free space } (h)/\text{thickness of mobile mass } (t).$$ [Equation 1]

4. The self-resonance tuning piezoelectric energy harvester with broadband frequency according to claim 3, wherein
    the swing torque of the mobile mass ($\tau$) is represented by following Equation 2, and is designed to be more than a specific value:

$$\tau = I\alpha$$
$$I = \int r^2 dm$$ [Equation 2]

in which, I is a moment of inertia, $\alpha$ is an angular acceleration of the mobile mass, m is a mass of the mobile mass, and r is a distance from a center of gravity of the mobile mass to an outermost-shell thereof.

5. The self-resonance tuning piezoelectric energy harvester with broadband frequency according to claim 4, wherein
    the mobile mass is configured so that a weight ratio of an outermost shell part of the mobile mass to the total weight of the mobile mass is over a specific ratio.

6. The self-resonance tuning piezoelectric energy harvester with broadband frequency according to claim 5, wherein
    the mobile mass has an upper flange, a lower flange and a web unit which connects the upper flange and the lower flange, and the through-hole having the free space is formed on the web unit.

7. The self-resonance tuning piezoelectric energy harvester with broadband frequency according to claim 1, wherein
    an output characteristic measured in the piezoelectric beam over time appears in a form of a sine wave, and the sine wave includes an inflection point at a point where a positive output is maximum.

8. The self-resonance tuning piezoelectric energy harvester with broadband frequency according to claim 1, wherein
    the piezoelectric beam includes a substrate, and a piezoelectric energy harvester unit element which receives a bending moment, and
    the piezoelectric energy harvester unit element includes a first electrode, a piezoelectric material disposed on the first electrode, and a second electrode disposed in the piezoelectric material.

9. The self-resonance tuning piezoelectric energy harvester with broadband frequency according to claim 8, wherein
    the piezoelectric material includes one piezoelectric multi- or mono-crystal selected from the group consisting of PZT, $Pb(Zn_{1/3}Nb_{2/3})O_3$—$PbTiO_3$ (PZN-PT), $[Pb(Mg_{1/3}Nb_{2/3})O_3]$—$[PbTiO_3]$ (PMN-PT), $(Na_xK_{1-x})NbO_3$ (NKN), $BaTiO_3$, ZnO, CdS and AlN, a piezoelectric mixture of at least one material consisting of Macrofiber composite (MFC) and 2-2 composite, or a polymer piezoelectric material including PVDF and PVDF-TrFE.

* * * * *